United States Patent
Morris et al.

(10) Patent No.: US 7,251,388 B2
(45) Date of Patent: Jul. 31, 2007

(54) APPARATUS FOR PROVIDING OPTICAL COMMUNICATION BETWEEN INTEGRATED CIRCUITS OF DIFFERENT PC BOARDS AND AN INTEGRATED CIRCUIT ASSEMBLY FOR USE THEREIN

(75) Inventors: Terrel L. Morris, Garland, TX (US); David Martin Fenwick, Chelmsford, MA (US); Richard John Luebs, Windsor, CO (US); Duane A. Wegher, Ft. Collins, CO (US); Jeffrey D. Yetter, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 273 days.

(21) Appl. No.: 10/915,641

(22) Filed: Aug. 10, 2004

(65) Prior Publication Data

US 2006/0034560 A1    Feb. 16, 2006

(51) Int. Cl.
*G02B 6/12*    (2006.01)
(52) U.S. Cl. .............................. 385/14; 385/32; 385/33
(58) Field of Classification Search ................. 385/14, 385/32, 33
See application file for complete search history.

(56) References Cited

U.S. PATENT DOCUMENTS

| | | | |
|---|---|---|---|
| 4,545,074 A | 10/1985 | Balliet et al. | |
| 4,568,931 A | 2/1986 | Biolley et al. | |
| 5,023,863 A | 6/1991 | Masuda | |
| 5,123,073 A | 6/1992 | Pimpinella | |

(Continued)

FOREIGN PATENT DOCUMENTS

EP    311 772    4/1989

(Continued)

OTHER PUBLICATIONS

B. Robertson, et al., "Design and Operation of an in situ Microchannel Alighment-Detection System", Applied Optics, vol. 37, No. 23, Aug. 10, 1998, p. 5368-5376, no date known.

(Continued)

*Primary Examiner*—Frank G. Font
*Assistant Examiner*—James P. Hughes

(57) ABSTRACT

Optical communication apparatus comprises: a first IC assembly disposed at a first PCB and comprising: a first IC package electrically coupled to circuits of the first PCB and having an opening in a bottom layer thereof; a first array of optical elements disposed in and electrically coupled to the first IC package and aligned with the bottom layer opening; and a tube of optical fibers disposed in the bottom layer opening with one end aligned under the first array and another end protruding out from the bottom layer of the first package and extending through a hole in the first PCB; a second IC assembly disposed at a second PCB, arranged in parallel with the first PCB, and comprising: a second IC package electrically coupled to circuits of the second PCB and having an opening in a top layer thereof; and a second array of optical elements disposed at the second IC package and electrically coupled thereto through the top layer opening; and wherein the second array being optically aligned with the optical fiber tube of the first IC package to accommodate optical communication between the arrays through the optical fibers of the tube. Various other embodiments of the apparatus are also disclosed.

5 Claims, 7 Drawing Sheets

U.S. PATENT DOCUMENTS

| | | | |
|---|---|---|---|
| 5,218,654 A | 6/1993 | Sauter | |
| 5,245,680 A | 9/1993 | Sauter | |
| 5,420,954 A | 5/1995 | Swirhun et al. | |
| 5,430,442 A | 7/1995 | Kaiser et al. | |
| 5,465,379 A | 11/1995 | Li et al. | |
| 5,477,363 A | 12/1995 | Matsuda | |
| 5,497,465 A | 3/1996 | Chin et al. | |
| 5,515,195 A | 5/1996 | McAdams | |
| 5,600,748 A | 2/1997 | Kosaka | |
| 5,631,988 A | 5/1997 | Swirhun et al. | |
| 5,764,834 A | 6/1998 | Hultermans | |
| 5,920,664 A | 7/1999 | Hirabayashi et al. | |
| 6,185,648 B1 | 2/2001 | Munoz-Bustamante | |
| 6,334,784 B1 | 1/2002 | Howard | |
| 6,363,182 B2 | 3/2002 | Mills et al. | |
| 6,379,053 B1 | 4/2002 | van Doorn | |
| 6,430,335 B1 | 8/2002 | Carberry et al. | |
| 6,509,992 B1 | 1/2003 | Goodwill | |
| 6,527,456 B1 | 3/2003 | Trezza | |
| 6,580,865 B1 | 6/2003 | Doorn | |
| 6,583,445 B1 * | 6/2003 | Reedy et al. | 257/82 |
| 6,583,904 B1 | 6/2003 | Mahlab et al. | |
| 6,587,605 B2 | 7/2003 | Paniccia et al. | |
| 6,588,943 B1 | 7/2003 | Howard | |
| 6,603,899 B1 | 8/2003 | Popp et al. | |
| 6,628,860 B1 | 9/2003 | Van Doorn | |
| 6,634,812 B2 | 10/2003 | Ozeki et al. | |
| 6,651,139 B1 | 11/2003 | Ozeki et al. | |
| 6,661,940 B2 | 12/2003 | Kim | |
| 6,674,971 B1 | 1/2004 | Boggess et al. | |
| 6,771,845 B2 * | 8/2004 | Levy et al. | 385/14 |
| 7,062,132 B2 * | 6/2006 | Basavanhally et al. | 385/52 |
| 7,146,106 B2 * | 12/2006 | Yang et al. | 398/138 |
| 2002/0102060 A1 * | 8/2002 | Jewell et al. | 385/49 |
| 2002/0149825 A1 | 10/2002 | Levy et al. | |
| 2002/0178319 A1 | 11/2002 | Sanchez-Olea | |
| 2003/0002770 A1 * | 1/2003 | Chakravorty et al. | 385/14 |
| 2003/0081281 A1 | 5/2003 | DeCusatis et al. | |

FOREIGN PATENT DOCUMENTS

| | | |
|---|---|---|
| EP | 351 729 | 1/1990 |
| EP | 367 460 | 5/1990 |
| EP | 811 862 | 12/1997 |
| EP | 868 049 | 9/1998 |
| EP | 1 180 912 | 2/2002 |

OTHER PUBLICATIONS

B. Robertson, "Design of an Optical Interconnect for Photonic Backplane Applications", Applied Optics, vol 37, No. 14, May 10, 1998, p. 2974-2984, no date known.

M. Jonsson, et al. "Optical Interconnection Technology in Switches, Routers and Optical Cross Connects", Ericsson Report, p. 1-43, no date known.

R. Sims, "Scaling Laws for MEMS Mirror-Rotation Optical Cross Connect Switches", Journal of Lightwave Technology, vol. 20, No. 7, Jul. 2002, p. 1084-1094, no date known.

F. Tooley, "Challenges in Optically Interconnecting Electronics", IEEE Journal of Selected Topics in Quantum Electronics, vol. 2, No. 1, Apr. 1996, p. 3-13, no date known.

* cited by examiner

APPARATUS FOR PROVIDING OPTICAL COMMUNICATION BETWEEN INTEGRATED CIRCUITS OF DIFFERENT PC BOARDS AND AN INTEGRATED CIRCUIT ASSEMBLY FOR USE THEREIN

BACKGROUND OF THE INVENTION

The present invention relates to optical communications, in general, and more particularly to apparatus for providing optical communication between integrated circuits of different printed circuit (PC) boards and an integrated circuit assembly for use therein.

Modem PC boards are comprised of a plurality of application specific integrated circuits (ASICs). Each of the ASICs of a PC board may include a digital data processor which performs its processing operations in parallel with the other ASICs of the board. In a data processing system, the ASICs of one PC board communicate with the ASICs of another PC board. Generally, the data communication between PC boards is through backplane or mother board electrical connections which present a bottleneck to the board-to-board communication. This communication bottleneck between boards is especially compounded by the parallel processing operations of the plurality of ASICs of each board.

Greater demands for increased bandwidth are being made on data communication between the ASICs of the different PC boards. Communication rates of tens of gigabits per second are exemplary of such demands. These demands can not be met by the traditional metal electrical connections found on mother boards and back plane connections, for example. One solution to meet these demands is to create optical communication channels for board-to-board communication using light coupling between an array of light emitters of one PC board and an array of light detectors of another PC board.

A drawback to this solution is that a light coupling interconnection between ASICs of different PC boards is no simple task. Thus, a simple and automatic interconnection of the light coupling between ASICs of different PC boards is desirable to render optical communication between ASICs a commercially viable reality. The present invention intends to satisfy this desire through suitable apparatus and integrated circuit assembly.

SUMMARY

In accordance with one aspect of the present invention, an integrated circuit assembly for providing optical communication between adjacent PC boards comprises: an integrated circuit package having an opening in a top layer and an opening in a bottom layer thereof; a first array of optical elements disposed at the integrated circuit package and electrically coupled to the integrated circuit package through the top layer opening; a second array of optical elements disposed in the integrated circuit package and aligned with the bottom layer opening; and a tube of optical fibers disposed in the bottom layer opening with one end under the second array and another end protruding out from the bottom layer of the package.

DETAILED DESCRIPTION OF THE INVENTION

Figure 1:
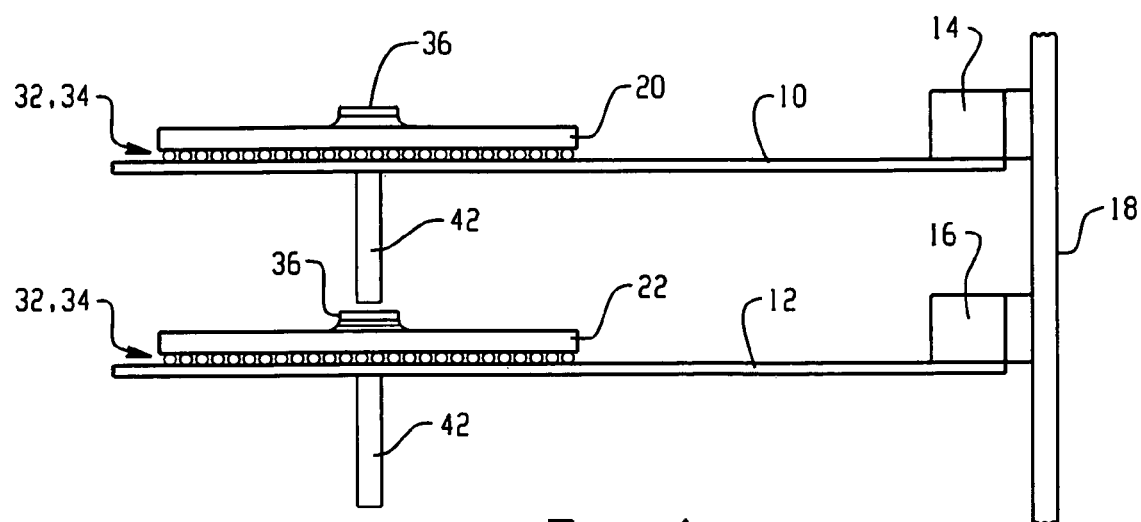
FIG. 1 is a side view illustration of optical fiber interconnection apparatus suitable for embodying one aspect of the present invention.

FIG. 1 is a side view illustration of optical fiber cable interconnection apparatus suitable for embodying one aspect of the present invention. In the present embodiment, two PC boards 10 and 12 of a data processing system, for example, are disposed in a parallel side-by-side configuration. The PC boards 10 and 12 of the present embodiment may be fixed in place in the parallel configuration through board connectors 14 and 16, respectively, of a backplane or a motherboard 18. Board to board parallel spacing may be further maintained using card guides mounted in the chassis, for example, that capture and align the edges of one board 10 parallel to the other board 12. Apparatus is provided to support optical communication between an integrated circuit (IC) package 20, such as an ASIC, for example, of one board 10 and an IC package 22, such as an ASIC, for example, of the other board 12 through a rigid tube of optical fibers as will become more evident from the following description. This apparatus permits an automatic alignment of the optical fibers of the rigid tube between the two ASICs 20 and 22 once the two boards 10 and 12 are connected to the backplane or motherboard 18 via connectors 14 and 16, respectively.

Figure 2:
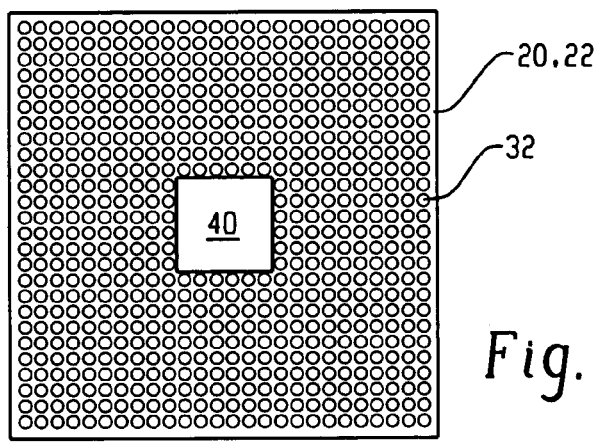
FIG. 2 is a bottom view illustration of an integrated circuit package suitable for use in the embodiment of FIG. 1.
Figure 4:
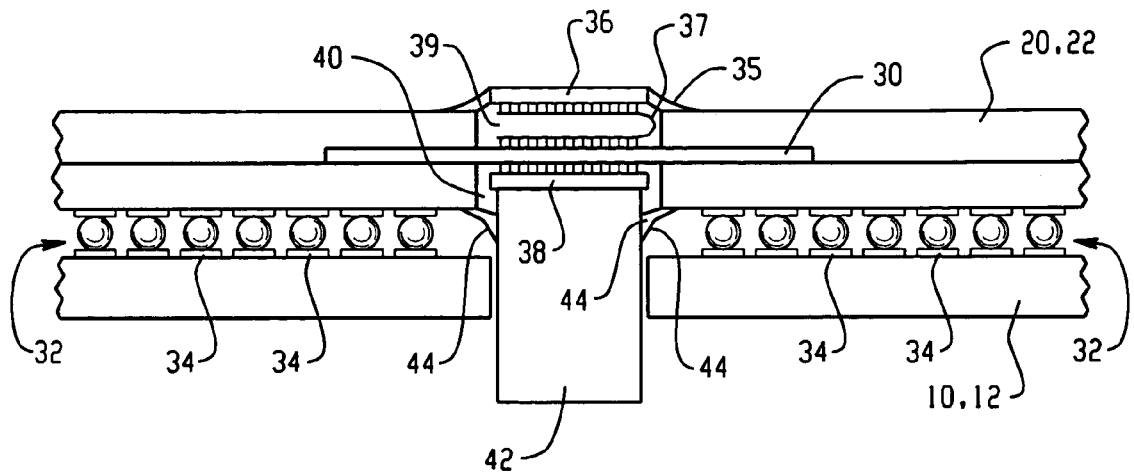
FIG. 4 is a cross-sectional, cut-away illustration of an exemplary IC package assembly suitable for embodying another aspect of the present invention.

A cross-sectional illustration of a more detailed cut-away view of an exemplary IC package 20, 22 is shown in FIG. 4. Referring to FIG. 4, each exemplary package 20, 22 includes an IC chip or die 30 which may be connected to the circuits of the PC board through a ball grid array 32 which is shown by way of example in the bottom package view of FIG. 2. Referring back to FIG. 4, the balls of the connecting array 32 make electrical connection with corresponding connection pads 34 of the PC runs of the board 10, 12. While a ball grid array is used in the present embodiment as the connecting array 32 between the package 20, 22 and the circuits of board 10, 12, it is understood that a solder column array or a land grid array of pads or similar connecting arrangement may be used just as well.

In the present embodiment, an array of optical elements 36 is disposed at the top of the IC package 20, 22 and electrically connected to circuits of the ASIC die 30 through use of a flex cable connector 37, for example, which is passed through an opening 39 in the top of the package 20, 22. The flex cable 37 may be connected to the die 30 and array 36 using C4 bumps or other suitable die attachments, for example. The array 36 may be secured in place on the package 20, 22 with an adhesive 35, which may be an epoxy resin or similar adhesive material, for example. A similar array of optical elements 38 is disposed on or embedded in a portion of a bottom surface of the die 30. The optical elements of arrays 36 and 38 are connected to respective data input and output circuits of the ASIC die 30. Another opening 40 is provided in a bottom layer of the package 20, 22 (see also FIG. 2) and aligned with the array 38 to accommodate access to the array 38 through the bottom layer of the package. While in the present embodiment the arrays 36 and 38 are shown disposed at the center of the package 20, 22, it is understood that they may be located anywhere around the die 30 or even attached to the package itself without deviating from the broad principles of the present invention.

Figure 3:
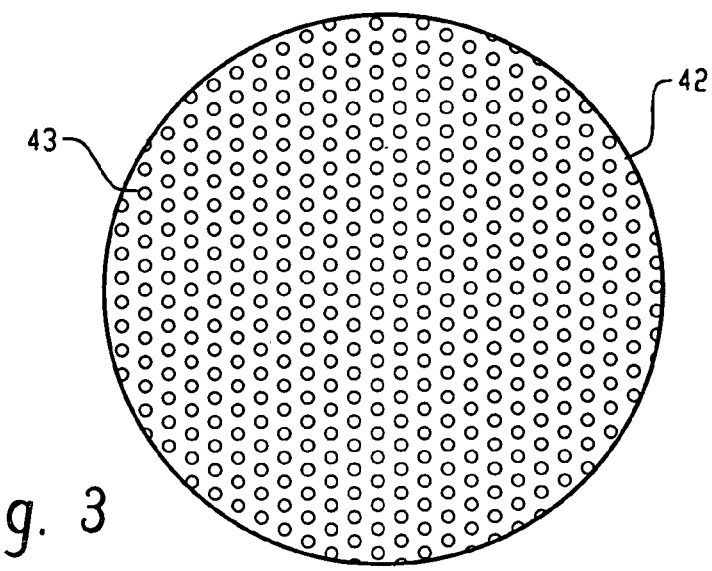
FIG. 3 is an end view illustration of an optical fiber cable suitable for use in the embodiment of FIG. 1.

Disposed in the opening 40 is a rigid tube 42 enclosing a multiplicity of optical fibers 43 such as shown by way of example in the end view illustration of FIG. 3. The optical fibers 43 of the tube 40 may be aligned with the optical elements of the array 38 which may be light emitters, light detectors or a combination thereof, for example. Preferably, the cross-sectional area of the tube of optical fibers 42 should extend beyond the area of the array 38 so that the elements of the array 38 will align within the cross-sectional area of the tube 42 notwithstanding a rough alignment therebetween. A cross-sectional view illustration of the alignment of the optical fibers 43 with the elements of the array 38 is shown in greater detail in FIG. 4A. The tube 42, which may be made of molded plastic, glass or an epoxy compound, for example, may protrude from the package 20, 22 down through a hole in the PC board 10, 12 and extend in length to just above a corresponding ASIC package on the adjacent PC board as shown in FIG. 1, for example. The tube 42 may be secured in place in the opening 40 of the package 20, 22 with an adhesive 44, which may be an epoxy resin or similar adhesive material, for example.

Figure 5:
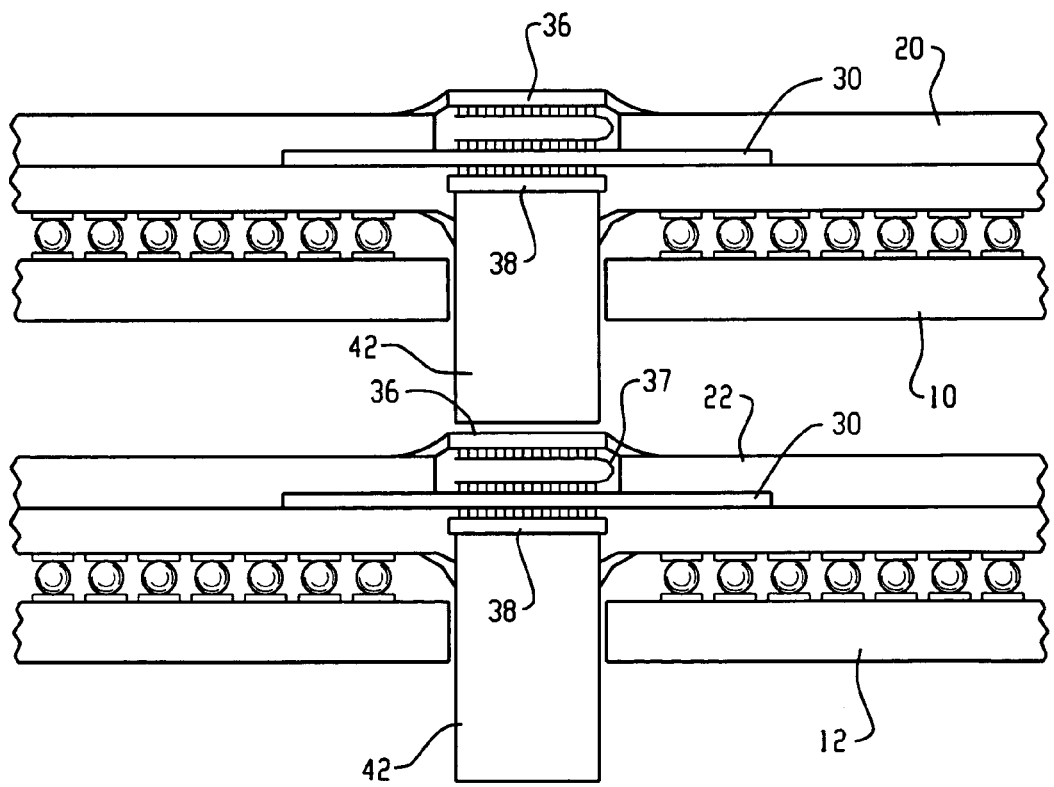
FIG. 5 is a side view illustration of the optical fiber interconnection apparatus of FIG. 1 in greater detail.
Figure 4A:
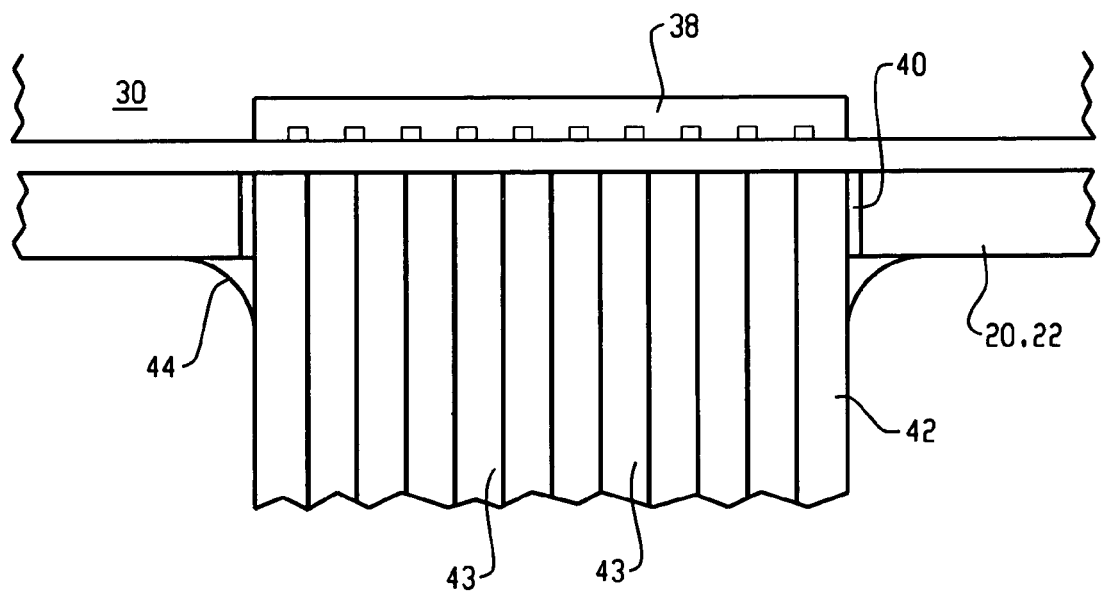
FIG. 4A is cross-sectional, cut-away illustration of the optical interface of the embodiment of FIG. 4 in greater detail.

Accordingly, when the adjacent PC boards 10 and 12 are connected to the motherboard 18 via connectors 14 and 16, respectively, as shown in the cross-sectional side view of FIG. 5, the optical fibers 43 at the bottom end of the tube 42 will automatically come in close proximity to and roughly align with the elements of array 36 permitting optical communication between the optical array 38 of package 20 and the optical array 36 of package 22. For example, the optical array 38 of the ASIC 20 will optically interface through free-space with the optical fibers 43 at the top end of aligned tube 42 as shown in FIG. 4A, by way of example, and the optical fibers 43 at the bottom end of tube 42 will roughly self-align in free-space with the elements of the top optical array 36 of the ASIC 22. The array 36 and/or array 38 may include beam steerable emitters to align their emitted beams with corresponding optical fibers 43 of the tube 42. A suitable optical channel configuration process may be also used to match elements of the arrays 36 and 38 through the optical fibers 43 of the tube 42 to form the optical communication channels therebetween.

FIG. 4A is a cross-sectional, cut-away illustration of the optical interface between the optical array 38 of the integrated circuit die 30 and the optical fibers 43 of the corresponding tube 42. Referring to 4A, the tube 42 is shown disposed in the opening 40 under and in close proximity to the optical array of elements 38. The free-space distance between the ends of the optical fibers 43 and the elements of array 38 may be only a fraction of an inch, preferably a few thousandths of an inch, for example. In the present embodiment, the cross-sectional area of the tube 42 is larger than the area of the array 38 to accommodate for less than a precise alignment therebetween. In addition, there may be substantially more optical fibers 43 in the tube 42 than there are elements in array 38 to increase the probability that each of the elements of array 38 will align with at least one of the optical fibers of tube 42.

Note that the ASIC 20 of board 10 may also communicate optically in the same manner through its optical array 36 with a corresponding ASIC on a PC board above board 10 (not shown) in a periscope arrangement. Likewise, the ASIC 22 of board 12 may also communicate optically in the same manner through its optical array 38 with a corresponding ASIC on a PC board below board 12 (not shown) in a similar periscope arrangement.

In one embodiment, the ASIC chip, optical top and bottom arrays and corresponding fiber optic tubing may be fabricated together in each IC package assembly prior to mounting on a PC board. When mounting the fabricated package assembly to a PC board, the bottom tube 42 may be disposed through the corresponding opening in the PC board and the balls 32 of the IC package connecting array may be aligned and connected electrically to the corresponding pads 34 of the PC runs. The positioning of the corresponding IC packages of the different boards may be precisely co-aligned for the foregoing described optical periscope arrangement in the design of the PC boards themselves.

In some applications, the IC packages may need a heat sink for dissipation of the heat that may be generated in the electrical processing operations of the ASIC chip itself. Some ASIC chips include thousands of circuits which generate a substantial amount of heat during the data processing operations thereof. A build up of heat in the package could damage the ASIC chip if not dissipated. Generally, a heat sink of a fin type which enlarges the heat dissipating surface area is disposed on the top surface of the package to dissipate the package heat to the air and keep the ASIC chip at a safe operating temperature. If a heat sink is disposed on the top surfaces of the IC packages, the periscope embodiment described in connection with FIGS. 1-5 herein above will not permit the boards 10 and 12 with mounted heat sinked IC packages 20 and 22 to slidably connect to the motherboard 18 because the heat sinks will interfere with the tubing 42.

Figure 7A:
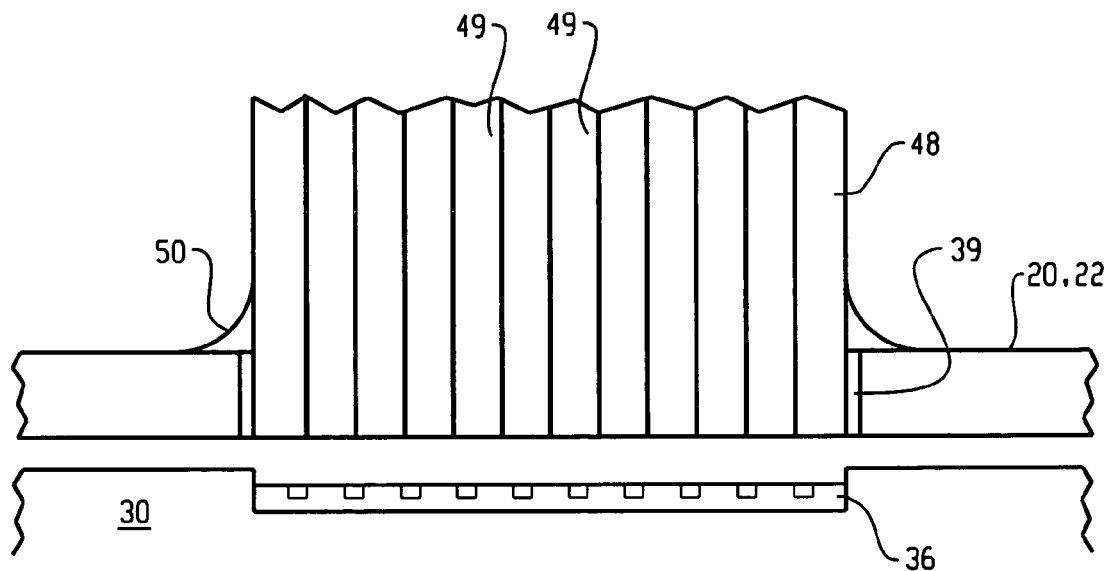
FIG. 7A is cross-sectional, cut-away illustration of the optical interface of the embodiment of FIG. 7 in greater detail.
Figure 6:
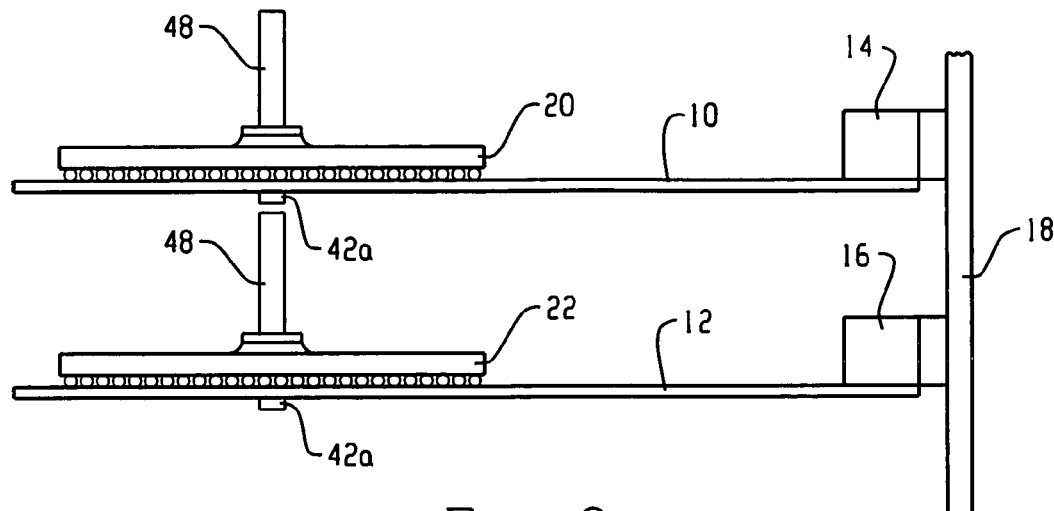
FIG. 6 is a side view illustration of optical fiber interconnection apparatus suitable for embodying yet another aspect of the present invention.
Figure 7:
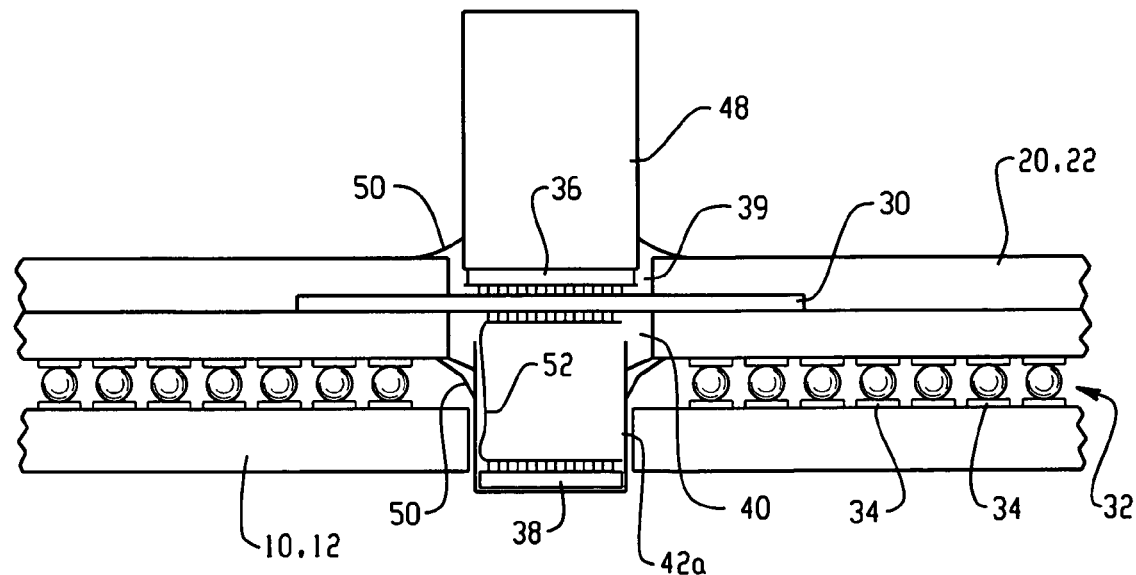
FIG. 7 is a cross-sectional, cut-away illustration of an exemplary IC package assembly suitable for embodying yet another aspect of the present invention.

For these heat sink applications, an alternate embodiment of the present invention such as shown by way of example in FIGS. 6 and 7 may be used. Referring to FIGS. 6 and 7, in place of tube 42, a shortened tube 42a is disposed in the opening 40 of the IC package 20, 22. The tube 42a is shorter in length than tube 42 and in the present embodiment, has just enough length to pass through the opening in the PC board 10, 12 and protrude only a short distance, like a fraction of an inch, for example, beyond the surface of the board. The optical array 38 may be disposed at the bottom end of tube 42a and electrically connected to circuits of the die 30 through a flex cable connector 52, for example. The flex wiring of connector 52 may pass from the optical array 38 through the a hollow passageway of tube 42a to the die 30 to render an electrical connection therebetween.

In addition, an optical fiber tube 48 is disposed at a bottom end through the top opening 39 of package 20, 22 and aligned over the optical array 36 which is disposed at the top surface of or embedded in the die 30 and electrically connected to circuits thereof. The optical fiber tube 48 extends in length from the package opening 39 up to the bottom of tube 42a of the corresponding IC package of the adjacent PC board as shown in FIG. 6. Both tubes 42a and 48 may be fixed in place at their respective openings of the package 20, 22 with an adhesive material 50, for example, in a similar manner as described for the embodiment of FIG. 1. Accordingly, when the two boards 10 and 12, for example, are connected to their corresponding connectors 14 and 16, the external ends of the tubes 42a and 48 will be in close proximity and aligned as shown in the illustration of FIG. 6.

Figure 8:
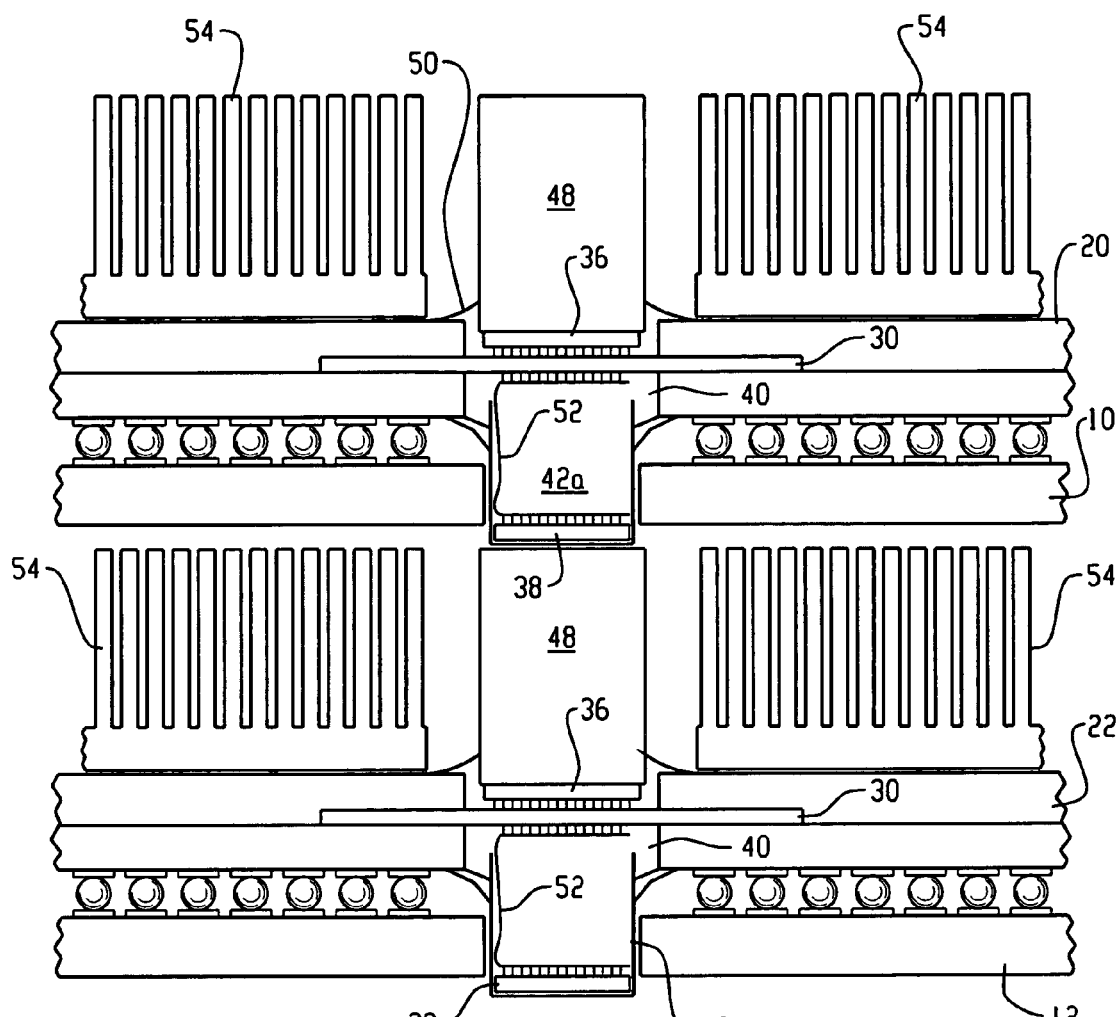
FIG. 8 is a side view illustration of the optical fiber interconnection apparatus of FIG. 6 with heat sinks on the IC packages.

Note that since tube 48 periscopes up from the top surface of its IC package 22, for example, to align with the tube 42a of its corresponding IC package 20, for example, on the adjacent PC board, a heat sink 54 may be disposed on the surface of each IC package 20 and 22 surrounding the tube 48, as shown in the illustration of FIG. 8. The heat sinks 54 will dissipate heat from the packages 20 and 22 to the air. In the embodiment depicted in FIG. 8, the heat sinks 54 will not interfere with the slidable connection of adjacent PC boards 10 and 12 with mounted package assemblies 20 and 22 in accordance with the present invention.

Accordingly, when the adjacent PC boards 10 and 12 are connected to the motherboard 18 via connectors 14 and 16, respectively, as shown in the cross-sectional side view of FIG. 8, the optical fibers at the top end of the tube 48 will automatically come in close proximity to and roughly align with the elements of array 38 permitting optical communication between the optical array 38 of package 20 and the optical array 36 of package 22. For example, the optical array 36 of the ASIC 22 will optically interface through free-space with optical fibers 49 at the bottom end of aligned tube 48 as shown in FIG. 7A, by way of example, and the optical fibers 49 at the top end of tube 48 will roughly self-align in free-space with the elements of the optical array 38 of the ASIC 20. The array 36 and/or array 38 may include beam steerable emitters to align their emitted beams with corresponding optical fibers 49 of the tube 48. A suitable optical channel configuration process may be also used to match elements of the arrays 36 and 38 through the optical fibers 49 of the tube 48 to form the optical communication channels therebetween.

Note that the ASIC 20 of board 10 may also communicate optically in the same manner through its optical array 36 with a corresponding ASIC on a PC board above board 10 (not shown) in a periscope arrangement. Likewise, the ASIC 22 of board 12 may also communicate optically in the same manner through its optical array 38 with a corresponding ASIC on a PC board below board 12 (not shown) in a similar periscope arrangement.

In this alternate embodiment, the ASIC chip 30, optical top and bottom arrays 36 and 38 and corresponding tubing 42a and 48 may be fabricated together in each IC package assembly prior to mounting on a PC board. When mounting the fabricated package assembly to a PC board, the bottom tube 42a may be disposed through the corresponding opening in the PC board and the balls 32 of the IC package connecting array may be aligned and connected electrically to the corresponding pads 34 of the PC runs. The positioning of the corresponding IC packages of the different boards may be precisely co-aligned for the foregoing described optical periscope arrangement in the design of the PC boards themselves.

FIG. 7A is a cross-sectional, cut-away illustration of the optical interface between the optical array 36 of the integrated circuit die 30 and the optical fibers 49 of the corresponding tube 48. Referring to 7A, the tube 48 is shown disposed in the opening 39 over and in close proximity to the optical array of elements 36. The free-space distance between the ends of the optical fibers 49 and the elements of array 36 may be only a fraction of an inch, preferably a few thousandths of an inch, for example. In the present embodiment, the cross-sectional area of the tube 48 is larger than the area of the array 36 to accommodate for less than a precise alignment therebetween. In addition, there may be substantially more optical fibers 49 in the tube 48 than there are elements in array 36 to increase the probability that each of the elements of array 36 will align with at least one of the optical fibers of tube 48.

Also, a large number of optical fibers in the tube 48 will increase the probability that light from an optical fiber in tube 48 will pass to an element of array 36 when the adjacent boards are connected and the corresponding tube end is roughly aligned with the array 36. Moreover, a configuration process may be used to match light emitter/detector pairs between the arrays 36 and 38 of corresponding ASICs to form the optical channels therebetween. It is understood that not all of the elements of the arrays will be matched to form an optical channel. Thus, there may be less optical channels formed than there are elements in the arrays. Accordingly, designing the arrays with a greater number of elements than optical channels desired will increase the probability of reaching the number of channels desired in a matching process once the adjacent boards are connected and the corresponding tubes of optical fibers are roughly aligned.

Figure 9:
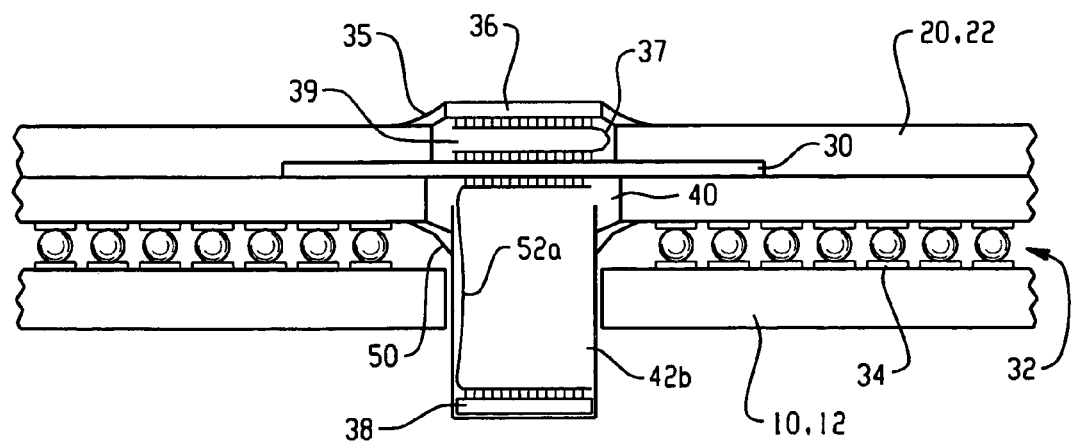
FIG. 9 is a cross-sectional, cut-away illustration of an exemplary IC package assembly suitable for embodying yet another aspect of the present invention.

In another alternate embodiment of the present invention as shown in the cross-sectional illustration of FIG. 9, the hollow rigid tube 42a of the embodiment depicted in FIGS. 6-8 may be replaced with a longer, hollow, rigid tube 42b and the optical element array 38 may be displaced from the ASIC chip 30 and disposed at the end of the tube 42b and secured in place with an adhesive material, for example. A longer flex cable connector 52a may connect the elements of the array 38 to corresponding circuits of the IC chip 30. The flex wire cable of 52a may be passed from the chip 30 through the hollow portion of the tube 42b to the array 38. The optical array 36 may be disposed at the package 20, 22 and electrically connected to circuits of the die 30 in much the same way as described supra for the embodiment of FIGS. 1-5.

Figure 10:
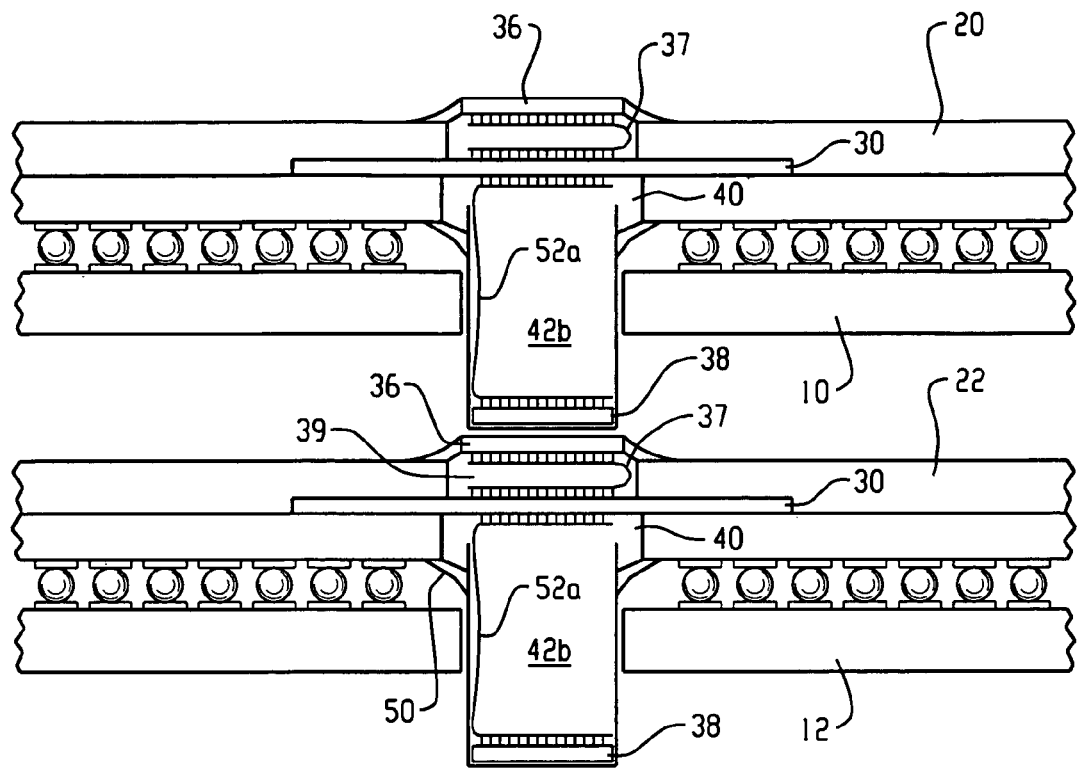
FIG. 10 is a side view illustration of optical fiber interconnection apparatus using the IC package assemblies of FIG. 9 suitable for embodying yet another aspect of the present invention.

In this embodiment, the tube 42b may extend through the hole in the PC board 10, 12 and extend down to render the optical array 38 aligned with and in close proximity to the optical array 36 as shown, by way of example, in the cross-sectional side view illustration of FIG. 10. Thus, when the boards 10 and 12 are slid in place and connected to their motherboard 18, the arrays 36 and 38 will be roughly aligned in close proximity of each other for optical communication over the free-space therebetween which may be preferably only a fraction of an inch by design. Accordingly, light from emitters of one array will be conducted over free-space to light detectors of the other array.

Figure 11:
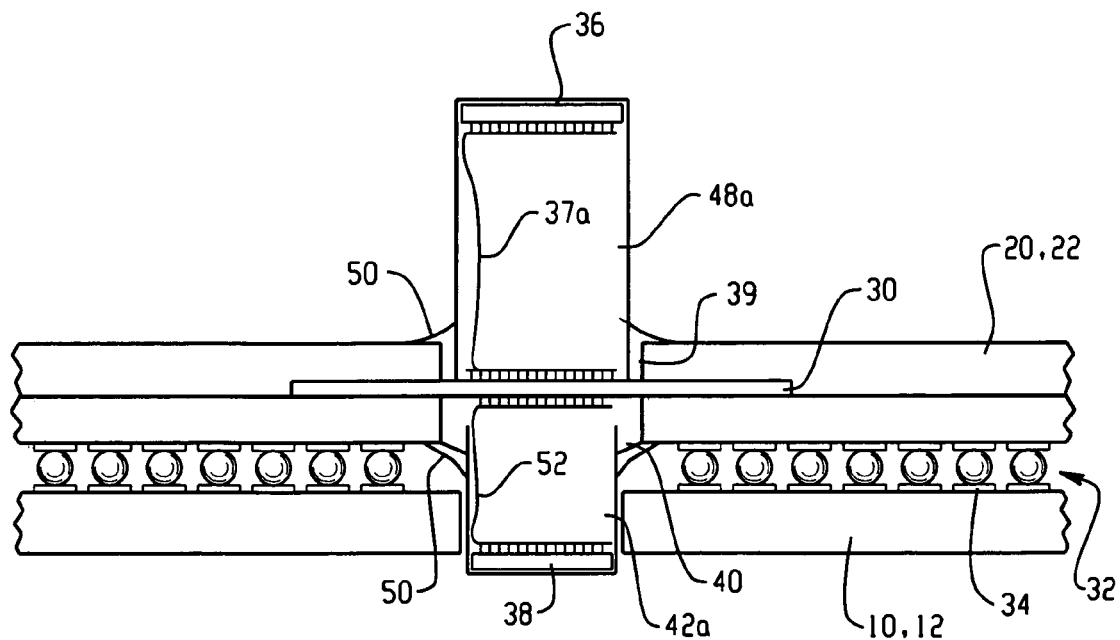
FIG. 11 is a cross-sectional, cut-away illustration of an exemplary IC package assembly suitable for embodying yet another aspect of the present invention.

In yet another alternate embodiment shown by way of example in FIG. 11, the fiber optic tube 48 of the embodiment of FIGS. 7 and 8 may be replaced with a hollow tube 48a, which may be similar to the hollow tube 42b described in connection with the embodiment of FIG. 9, for example, and the array 36 may be displaced from the IC package and disposed at the external end of the hollow tube 48a. Also, the array 36 may be electrically connected to the circuits of the die 30 through a flex cable connector 37a similar to 52a described in connection with the embodiment of FIG. 9. Note that the flex cable connector 37a is substantially longer than cable 37 of FIG. 9. The resulting embodiment of FIG. 11 will have the array 38 disposed at or near the bottom of board 10, 12 for example, and the array 36 at the top of the hollow tube 48a so that when the boards 10 and 12 are connected to their respective connectors 14 and 16, the arrays 36 and 38 will be roughly aligned and in close proximity to each other. Thus, instead of the hollow tube 42b extending down through the board 10 to the package 22 of board 12 such as shown in FIG. 10, the hollow tube 48a will extend up from package 22 of board 12 to the board 10 such as shown in FIG. 11.

It is understood that due to a rough alignment between arrays 36 and 38 in the foregoing embodiments, light from all of the emitters of one array may not be detected by corresponding light detectors of the other array. Thus, in order to provide for a desired number of optical channels between the IC packages of different PC boards with these embodiments, it is further preferred that the number of elements of one of the arrays 36 or 38 be substantially greater than the number of elements of the other array in order to achieve the desired number of optical channels. With such a design, there will be a greater probability to match light emitter/detector pairs of the two arrays 36 and 38 to form the desired number of optical channels through a suitable optical channel configuration process. Alternatively, the emitters of arrays 36 and 38 may be beam steerable emitters controllable to render the beams thereof to be steered in alignment with a corresponding detector to form the optical communication channels.

While the various embodiments described herein above provided for optical communication between an integrated circuit 20 of one PC board 10 and an integrated circuit 22 of an adjacent PC board 12 using periscope arrangement of tubes affixed to the integrated circuit packages 20 and 22, it is understood the principles of the present invention may be extended to provide optical communication between a plurality of such integrated circuit package assemblies of adjacent PC boards such as shown by way of example in the illustration of FIG. 12.

Figure 12:
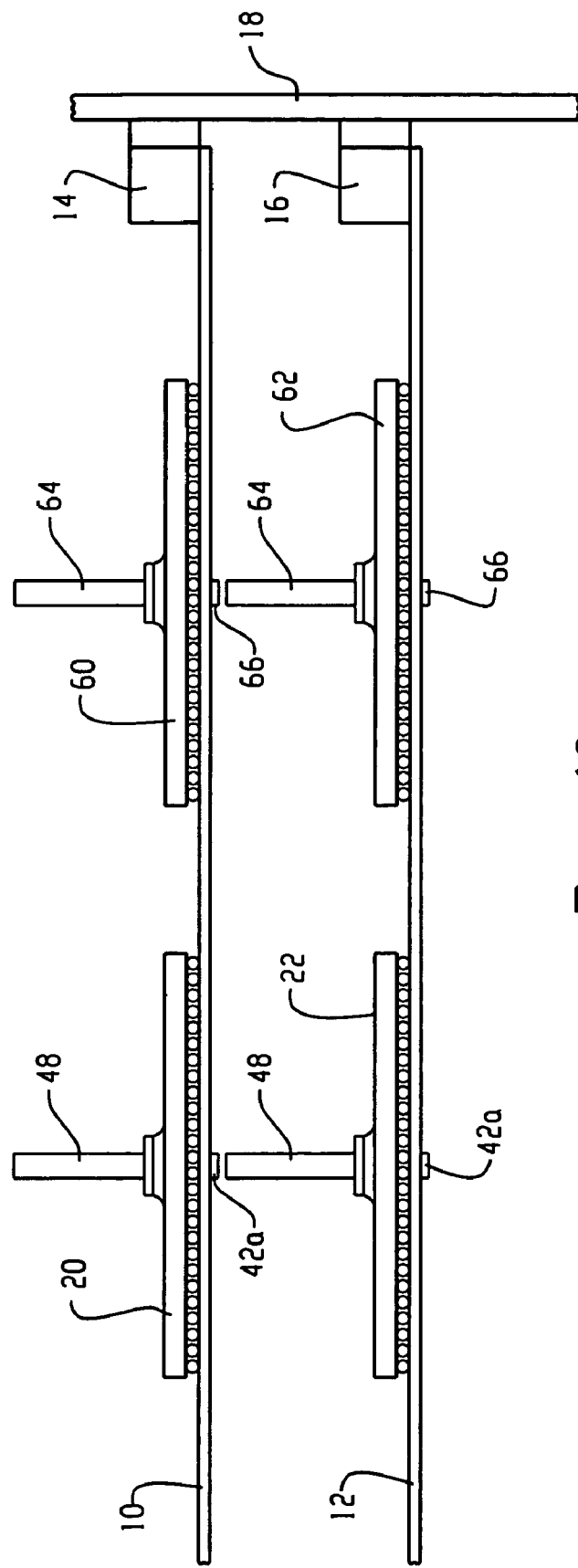
FIG. 12 is a side view illustration of optical fiber interconnection apparatus suitable for embodying a further aspect of the present invention.

Referring to FIG. 12, at least one other integrated circuit package 60 may be disposed on PC board 10 and at least one corresponding package 62 may be disposed on the adjacent PC board 12. The packages 60 and 62 may be fabricated, by way of example, with a periscope arrangement of tubes 64 and 66 in accordance with the embodiment of FIGS. 6-8 as described herein above to provide optical communication between the ICs 60 and 62. The PC boards 10 and 12 may be designed in such a manner that the plurality of communicating pairs of ICs are precisely located on the boards so that when the boards are connected in their respective connectors, the ends of the corresponding periscope tubes 42a and 48 will be roughly aligned as shown in FIG. 12.

In summary, the periscope IC package enables optical communication between at least one integrated circuit pair of adjacent boards. In the foregoing described embodiments, the periscope arrangement was integrated into and became an integral part of an IC package which has other non-optical functions. Thus, the IC package became operative to communicate by both optical and electrical channel connections. The various embodiments of the present invention offered a simple and automatic optical alignment from which optical channels may be configured through a suitable configuration process. The resulting optical communication channels yield an increase in the communication bandwidth between the integrated circuit pairs of the adjacent boards over that afforded by electrical connection paths through a mother board or backplane, for example.

In addition, while the foregoing described embodiments have referred to the tubes of the various embodiments as being round in cross-sectional shape, it is understood that the tubes may take upon other cross-sectional shapes without deviating from the principles of the present invention. Also, in the various embodiments, a hollow tube has been used as a structure to support the array of optical elements away from the integrated circuit 30. However, it is further understood that this need not be the case. For example, an angle bracket or other physical support structure may be used just as well to support the array of optical elements away from the integrated circuit 30. Moreover, while an enclosed support structure, be it a tube or otherwise, is preferable, this need not be the case.

While the present invention has been described herein above in connection with a variety of embodiments, it is understood the such embodiments were presented merely by way of example and not intended to limit the invention in any way. Thus, the present invention should not be limited by any of the embodiments present above, but rather construed in breadth and broad scope in accordance with the recitation of the claims appended hereto.

What is claimed is:

1. An integrated circuit assembly for providing optical communication between adjacent PC boards, said assembly comprising:
    an integrated circuit package having an opening in a top layer and an opening in a bottom layer thereof;
    a first array of optical elements disposed at said integrated circuit package and electrically coupled to said integrated circuit package through said top layer opening;
    a second array of optical elements disposed in said integrated circuit package and aligned with said bottom layer opening; and
    a tube of optical fibers disposed in said bottom layer opening with one end under said second array and another end protruding out from said bottom layer of the package.

2. The assembly of claim 1 wherein the package includes: an integrated circuit chip; and electrical contacts for electrically coupling said integrated circuit chip to circuits external said package; and wherein the optical elements of the first and second arrays are electrically coupled to said integrated circuit chip.

3. The assembly of claim 1 wherein one end of the optical fiber tube is aligned with and disposed in close proximity to the optical elements of the second array integral to the package.

4. The assembly of claim 1 wherein the tube of optical fibers is secured in place in the bottom layer opening.

5. The assembly of claim 1 wherein the optical fibers of the tube are greater in number than the optical elements of the second array.

* * * * *

UNITED STATES PATENT AND TRADEMARK OFFICE
CERTIFICATE OF CORRECTION

| | | |
|---|---|---|
| PATENT NO. | : 7,251,388 B2 | Page 1 of 1 |
| APPLICATION NO. | : 10/915641 | |
| DATED | : July 31, 2007 | |
| INVENTOR(S) | : Terrel L. Morris et al. | |

It is certified that error appears in the above-identified patent and that said Letters Patent is hereby corrected as shown below:

In column 1, line 14, delete "Modem" and insert -- Modern --, therefor.

Signed and Sealed this

Sixth Day of October, 2009

David J. Kappos
*Director of the United States Patent and Trademark Office*